United States Patent

Hull et al.

[11] Patent Number: 5,991,910
[45] Date of Patent: Nov. 23, 1999

[54] MICROCONTROLLER HAVING SPECIAL MODE ENABLE DETECTION CIRCUITRY AND A METHOD OF OPERATION THEREFORE

[75] Inventors: Richard L. Hull; Scott Ellison, both of Chandler; Paul Hofhine, Mesa, all of Ariz.

[73] Assignee: Microchip Technology Incorporated, Chandler, Ariz.

[21] Appl. No.: 08/960,636

[22] Filed: Oct. 29, 1997

[51] Int. Cl.⁶ ................................................. G01R 31/28
[52] U.S. Cl. ............................ 714/733; 326/16; 714/724
[58] Field of Search .............................. 371/22.5; 326/16; 395/280; 713/300; 710/100; 714/724, 733, 734

[56] References Cited

U.S. PATENT DOCUMENTS 4,733,168  3/1988  Blankenship et al. .................. 326/16
5,786,703  7/1998  Piirainen .............................. 371/22.5

Primary Examiner—Glenn A. Auve
Attorney, Agent, or Firm—Paul N. Katz; Ronald L. Chichester; Frohwitter

[57] ABSTRACT

A free-running microcontroller (i.e., one without any reset signal) is shown with special mode enable detect logic for placing the microcontroller into the test or special operations mode, without the benefit of a dedicated pin for such purposes. Rather, the instant invention implements the methodology of first applying a test voltage to indicate to the free-running microcontroller that the test mode is to be entered. Since the device has no reset signal to interrupt normal operation once it has begun, the test voltage is applied before the power supply $V_{DD}$ to ensure that the device enters test mode before it can enter normal operation.

19 Claims, 2 Drawing Sheets

MICROCONTROLLER HAVING SPECIAL MODE ENABLE DETECTION CIRCUITRY AND A METHOD OF OPERATION THEREFORE

BACKGROUND OF THE INVENTION

1. Field of the Invention

This invention is in the field of microcontrollers and methods of operation therefore and, more particularly, is a microcontroller having special mode enable detection circuitry and a method of operation therefore.

2. Description of the Related Art

Special modes can be used with microcontroller devices for a variety of reasons, the most common of which is to test the device in a non-user environment (i.e., when the device is not in normal operation). Due to the common use of special modes as a means for testing a device, some simply refer to the special operating mode as a test mode. It is known to those skilled in the art that functions other than device testing can be done in the special mode. Such other functions might include, but are not necessarily limited to, the built-in self-test (BIST) function, and device initialization in normal user (i.e., non-test) mode.

In order to enter a special operating mode, those in the past sometimes simply added an independent pin to the microcontroller that had the exclusive function of indicating that the device is to enter test or special operating mode. After applying power to the device, the dedicated special mode pin is set to a level that indicates to the device that it should stop normal execution, and begin operating in special mode. This approach has the obvious drawback that it wastes space (i.e., the dedicated pin for detecting special mode), and therefore, if space constraints are a concern for a device, this approach is not desirable. In an alternative prior art approach, there is no dedicated test mode detection pin for the microcontroller, but rather a shared pin that functions both as an Input/Output (I/O) pin and as a pin for detecting the test mode. This shared pin approach works as follows. When the test mode is to be entered, a voltage above $V_{DD}$ is applied to the shared pin to indicate that a test mode is to be initiated; however, such a technique requires that the microcontroller has some means for stopping normal device operation before testing—in other words a reset signal or the like is required. The situation at issue in the instant invention does not require a reset signal to interrupt normal microcontroller operation. Thus, this second prior art approach would not work in the situation involved with the instant invention.

In contrast to the prior art, the invention here arose from the necessity to enter a test mode on a microcontroller device that has a low pin count, and no means of keeping the device from free-running execution after applying power to the device. Here, the limitation of a "low pin count" means that the chip designer does not want to waste a pin for the exclusive function of identifying the initiation of the test mode—this could be the case in a microcontroller having very few pins (such as 8) or many (such as 64). The point is that the specific number of pins is not relevant. What is relevant is the fact that the designer doesn't want to waste space with using a dedicated pin for detecting the test mode. Further note that the situation here that necessitated the instant invention included the limitation that there was no means for the microcontroller to keep itself from free-running execution after applying power to the microcontroller device. In other words, the situation here involved a microcontroller that would not have a reset signal, either from an external reset signal input to the device via a reset pin or via some type of on chip software-generated reset signal well known to those skilled in the art. Since no reset signal was available for the microcontroller here involved, once $V_{DD}$ was applied to the device, there was no way to stop it, and enter a test mode for the device. Thus, for the purpose of discussion here, the term "free-running microcontroller" means a microcontroller without an externally provided reset signal, and without any type of on chip software or hardware induced reset signal for the microcontroller, or at least if such a software or hardware induced reset signal could be established, it has not been so established. In other words, a free-running microcontroller (which is the area of concern for the instant invention) has no reset signal to stop it from running once $V_{DD}$ has been applied to the microcontroller.

Therefore, there existed a need to provide a free-running microcontroller that can enter the test or special operations mode without the benefit of a dedicated pin for such purposes, and a method of operation therefore.

SUMMARY OF THE INVENTION

An object of the present invention is to provide a free-running microcontroller that can enter the test or special operations mode without the benefit of a dedicated pin for such purposes.

Another object of the present invention is to provide a method for entering the test or special operations mode for a free-running microcontroller without the benefit of a dedicated test or special operations mode pin for such purposes.

BRIEF DESCRIPTION OF THE PREFERRED EMBODIMENTS

According to the present invention, a device is disclosed comprising, in combination, a free-running microcontroller, and a plurality of Input/Output (I/O) pins for the free-running microcontroller wherein a shared pin of the plurality of I/O pins is provided with special mode enable detect logic. Each I/O pin of the plurality of I/O pins is provided with input logic and with output logic. The special mode enable detect logic comprises a NAND gate having a first input from the shared pin, and power up detect circuitry having an output coupled to a second input of the NAND gate. The special mode enable detect logic further comprises a transistor having an input connected to the shared pin, a first inverter connected to an output of the transistor, and a second inverter connected to the first inverter. Also, the second inverter has an output connected to the first input of the NAND gate. The special mode enable detect logic further comprises an inverter connected to an output of the NAND gate.

In this embodiment of the instant invention, the device further includes a first portion of control logic connected to an output of the special mode enable detect logic, and it has an output to a second portion of control logic. The second portion of control logic has an output enable line coupled to a portion of each I/O pin of the plurality of I/O pins, and the first portion of control logic is coupled to a portion of each I/O pin of the plurality of I/O pins.

In another embodiment of the instant invention, a method for placing a microcontroller device into a special operating mode is disclosed comprising the steps of providing a microcontroller, applying a test voltage to the microcontroller, and applying a supply voltage ($V_{DD}$) to the microcontroller, after the step of applying the test voltage.

This method further comprises the steps of providing a Power On Reset (POR) signal when $V_{DD}$ is at a level sufficient for running the microcontroller, detecting when the POR signal and a modified version of the test voltage are both at a high logic level, and providing a Special Mode Enable (SME) detect signal in response to detection of the POR signal and the modified version of the test voltage being at the high logic level. Additionally, the method comprises the steps of providing special mode control logic which is enabled by activation of the SME detect signal, and providing normal mode control logic. The special mode control logic is coupled to the normal mode control logic, and the normal mode control logic is coupled to each I/O pin of the microcontroller. This method further comprises the step of executing the special mode control logic in response to detection of the SME detect signal. An additional method step prevents execution of the normal mode control logic while the special mode control logic is executing. Also, this method includes the step of multiplexing different combinations of data into the special mode control logic which, when enabled by activation of the SME detect signal, will correspond to different functions to be performed by the special mode control logic. Preferably, the microcontroller in both embodiments is a free-running microcontroller, and the test voltage is greater than $V_{DD}$.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENTS

Figure 1:
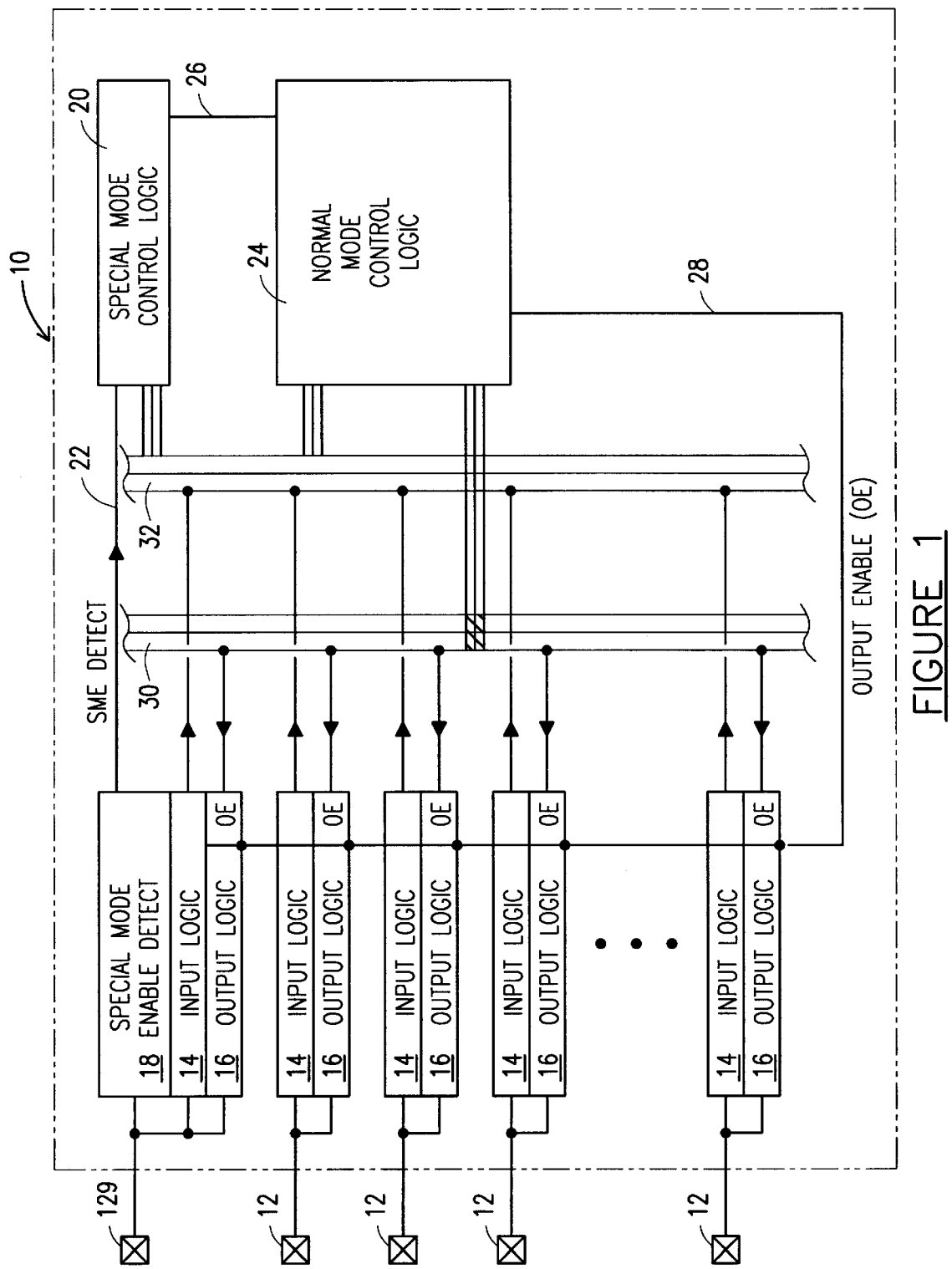
FIG. 1 is a simplified conceptual block diagram of a microcontroller including special mode enable detect logic.

Referring to FIG. 1, a simplified conceptual block diagram of a microcontroller is shown and generally designated by reference number 10. The device comprises, in combination, a free-running microcontroller 10, and a plurality of Input/Output (hereafter referred to as "I/O") pins 12 wherein a shared pin 12a of the plurality of I/O pins 12 is provided with Special Mode Enable Detect Logic 18 (hereafter referred to as "SMED or SMEDL"). Note that the term "free-running microcontroller" means a microcontroller 10 without an externally provided reset signal to a reset pin, and without any type of on chip, software or hardware induced reset signal for the microcontroller 10, or at least if such a software or hardware induced reset signal could be established, it has not been so established. In other words, free-running microcontroller 10 has no reset signal to stop it from running once $V_{DD}$ has been applied. Also, note that the three vertical dots shown between the bottom two I/O pins 12 is meant to indicate that more or less than the number of I/O pins 12 (and accompanying I/O logic 14 and 16) shown could be implemented, if desired; however, there would always be one shared pin like 12a. Each I/O pin 12 is provided with input logic 14 and with output logic 16. The microcontroller 10 further includes a first portion of control logic 20 (labeled "Special Mode Control Logic," hereafter referred to as "SMCL") connected to an output 22 from SMEDL 18, and SMCL 20 has an output 26 connected to a second portion of control logic 24 (labeled "Normal Mode Control Logic," hereafter referred to as "NMCL"). The NMCL 24 has an output enable line 28 coupled to a portion 16 of each I/O pin 12. Additionally, the SMCL 20 is coupled to a portion 14 of each I/O pin 12. Lastly, note that there are a plurality of buses 30 and 32 for communicating between the I/O pins 12 and the SMCL 20 and the NMCL 24.

Figure 3:
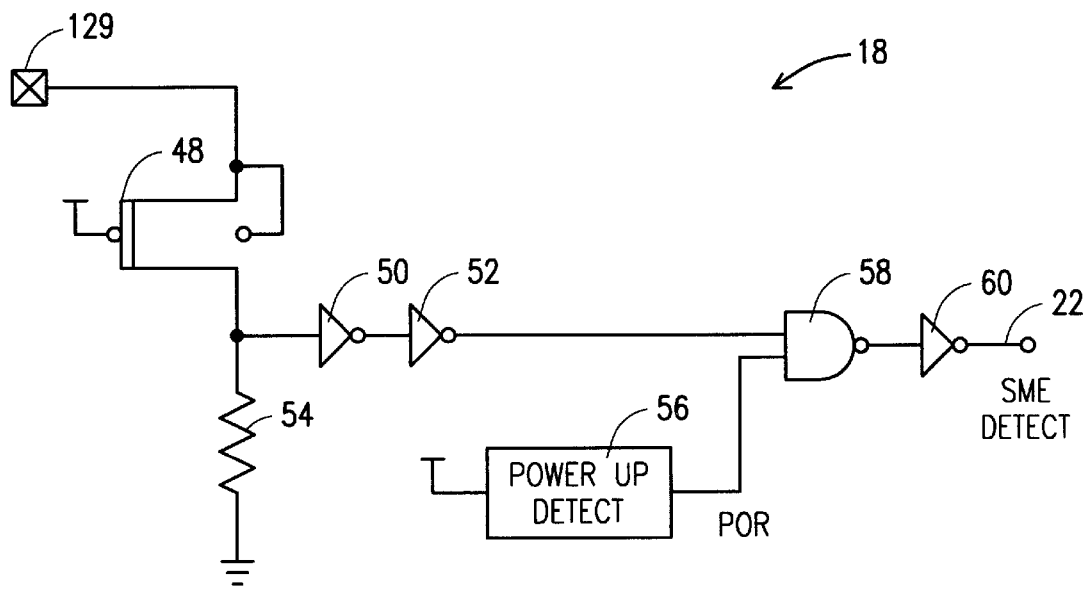
FIG. 3 is a simplified electrical schematic of the special mode enable detect logic from FIG. 1.

Referring to FIG. 3, a simplified electrical schematic of the SMEDL 18 from FIG. 1 is shown. The SMEDL 18 comprises a NAND gate 58 having a first input from the shared pin 12a, and Power Up Detect Circuitry 56 (hereafter "PUDC") having an output coupled to a second input of the NAND gate 58. The SMEDL 18 further comprises a transistor 48 having an input connected to the shared pin 12a, a first inverter 50 connected to an output of the transistor 48, and a second inverter 52 connected to the first inverter 50. Also, the second inverter 52 has an output connected to the first input of the NAND gate 58. The SMEDL 18 also includes an inverter 60 connected to an output of the NAND gate 58. Note that transistor 48 is preferably a PMOS type transistor having a well type connection back to a node corresponding to pin 12a. Also, note that the drain of transistor 48 is coupled to ground through resistor 54, and that the gate junction of transistor 48 is connected to $V_{DD}$.

OPERATION

The major thrust of the method embodying the instant invention is to first apply to the microcontroller device 10 a voltage above the level that $V_{DD}$ will be, once it is later applied. This first applied voltage corresponds to a test voltage or special operations mode voltage that is applied to the shared pin 12a of microcontroller or device 10. This test voltage or special operations mode voltage (hereafter "test voltage") is meant to indicate to device 10 that it is to enter the test mode of operation, in lieu of the normal mode of operation. The key aspect of this methodology is that the test voltage is applied first (i.e., before $V_{DD}$ is applied to device 10). Moreover, the test voltage is distinguishable from $V_{DD}$ in that their steady-state magnitudes differ by some significant amount. In particular, the test voltage is meant to exceed $V_{DD}$ by some detectable amount; however, those skilled in the art will realize after reading this disclosure that the test voltage could be set lower than $V_{DD}$, if desired, and the device 10 could operate substantially the same.

Once $V_{DD}$ is applied to device 10, the higher test voltage will be active as soon as the logic on device 10 is operational (i.e., once $V_{DD}$ reaches that value necessary for device circuitry to operate). In this way, device 10 cannot begin normal operational execution because as soon as $V_{DD}$ reaches the on chip operational level, device 10 will first recognize that it must go to test mode, thereby preventing the initiation of normal device operation while in test mode.

Figure 2:
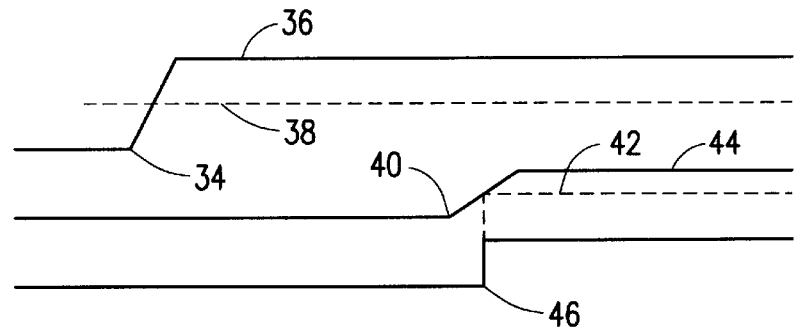
FIG. 2 is a timing diagram for the special mode enable detect logic of FIG. 1.

Now referring to FIG. 2, a timing diagram for the SMEDL 18 of FIG. 1 is shown. On the upper signal, at the point in time labeled 34, the test voltage (as represented by the solid line) is asserted. The upper portion 36 represents the steady-state amplitude of the test voltage, and the dashed line 38 represents the steady-state amplitude that $V_{DD}$ will attain, when later asserted. Note that the test voltage's steady-state amplitude is greater than that for $V_{DD}$. On the second signal down, at the point in time 40 (later than time 34), $V_{DD}$ (i.e., the solid line) is applied, and the amplitude represented by 44 corresponds to the steady-state value for $V_{DD}$. Note that dashed line 42 represents that amplitude of $V_{DD}$ necessary for the device's circuitry to operate. At a point in time slightly after the point in time when $V_{DD}$ crosses above dashed line 42, the PUDC 56 (see FIG. 3) asserts its output, which indicates that $V_{DD}$ is at an operational level for the device's circuitry. At that point in time, PUDC 56 outputs a high logic level, and the other input to NAND gate 58 also has a high logic level input, so NAND gate 58 outputs a low signal to inverter 60. The output of inverter 60 therefore is high, and this is the SME detect signal on line 22, which is represented by the assertion of a high signal at point 46 in the bottom signal of FIG. 2. Thus, soon after the level of $V_{DD}$ is sufficient for the device's logic to work, the SMEDL 18 outputs a high signal on line 22 to indicate to the SMCL 20 that the device 10 is to enter test mode. In this way, the NMCL 24 has no opportunity to drive the I/O pins 12 in a way that would interfere with the just initiated test mode. In particular, the SMCL 20 outputs data on a line or bus 26 which directs the NMCL 24 not to begin normal operation until SMCL 20 has completed its test mode operations. This is significant because, as stated previously, device 10 is free-running (i.e., it does not have a reset signal or the like to halt normal device operation, once it is initiated, and if it were initiated, it might well interfere with the test mode operation).

Now referring to FIGS. 1 and 3, and assuming that the test voltage is applied first, the SMEDL 18 will detect this condition. In particular, the test voltage is applied to shared pin 12a, and since the gate of transistor 48 is tied to $V_{DD}$ (which has not yet been asserted, and is therefor low), the transistor 48 will conduct to ground through resistor 54. At this point, since $V_{DD}$ has not yet been applied, the potential at the upper node of resistor 54 is not conducted through inverters 50 and 52 because they do not have a sufficient operational power level from $V_{DD}$. At some time later, $V_{DD}$ is applied. The PUDC 56, which is an element well known to those skilled in the art, has its input connected to a line for supplying $V_{DD}$. Once $V_{DD}$ is applied the PUDC 56 monitors its input to determine when $V_{DD}$ is at an operational level for device 10. When this level is attained, the PUDC 56 asserts its Power On Reset (POR) output high. Note that the term "POR" is well known to those skilled in the art to mean that $V_{DD}$ is at an operational level. Also, note that the time at which the PUDC 56 asserts POR high corresponds to a potential slightly higher than that actually required for the device's components to work. Thus, when PUDC 56 has asserted a high POR output, the high signal at the drain of transistor 48 has been twice inverted by inverters 50 and 52 to provide another high input to NAND gate 58. Accordingly, NAND gate 58 outputs a low signal that is inverted by inverter 60 to provide a high SME detect signal on line 22 to the SMCL 20.

The other I/O pins 12 (i.e., other than I/O pin 12a) can supply data to the SMCL 20, which when it receives the SME detect signal on line 22, will decipher the input data to determine which test mode or special operation it is to perform. The input path for this test mode identification data is from the input logic 14 for each I/O pin 12 other than shared I/O pin 12a to bus 32, and to the SMCL 20. When the SMCL 20 receives the SME detect signal, and possibly the test mode identification data (i.e., test mode identification data may not be required), it sends data over line or bus 26 to the NMCL 24 to inhibit it from driving the output logic 16 of one or more I/O pins 12 in a way that could cause contention with the externally applied test mode signals. The NMCL 24 inhibits the appropriate output logic blocks 16 on line or bus 28. Note that the NMCL 24 may be either fully or partially disabled by the SMCL 20. In other words, if the NMCL 24 is not needed, then the SMCL 20 fully disables it, and if some portions of the NMCL 24 is needed by the SMCL 20 in order to perform its testing operations, then the NMCL 24 would be disabled only to the extent that it is not needed. Note that the logic in SMCL 20 and in NMCL 24 necessary to carry out these operations could be implemented in any one of a number of ways well known to those skilled in the art, and therefore, they will not be formally discussed.

Figure 4:
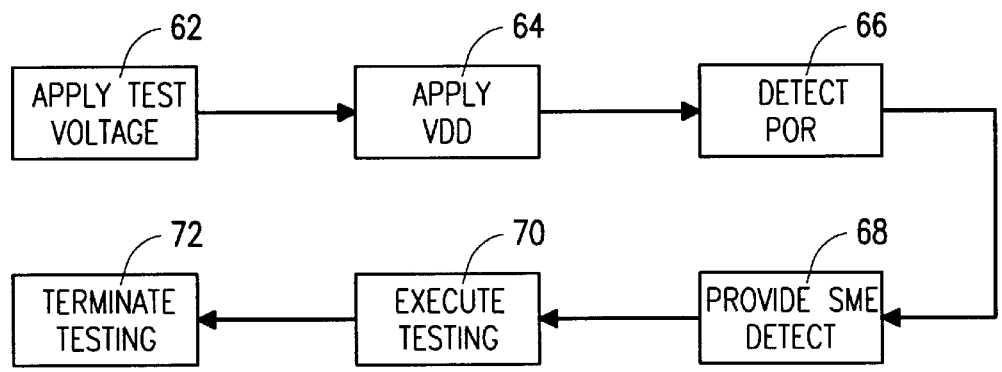
FIG. 4 is a simplified conceptual block diagram of the method of operation for a free-running microcontroller entering the test mode of operation per the instant invention.

FIG. 4 shows a simplified conceptual block diagram of the method of operation for the free-running microcontroller 10 entering the test mode of operation per the instant invention. The first step is to provide microcontroller 10. The next step signified by block 62 is to apply the test voltage to the microcontroller 10. In the preferred embodiment, the test voltage is held high during the testing; however, those skilled in the art realize that the high test voltage signal could be latched, and the test voltage de-asserted. After the step of applying the test voltage 62, block 64 represents the step of applying the supply voltage ($V_{DD}$) to the microcontroller 10. The step of providing the POR signal when $V_{DD}$ is at a level sufficient for running the microcontroller 10 is accomplished per the operation of the PUDC 56, as discussed previously. Block 66 represents the step of detecting when the POR signal and a modified version of the test voltage are both at a high logic level. The phrase "modified version of the test voltage" corresponds to the modification of the test voltage by inverters 50 and 52. The detection of when these two inputs are both at a high logic level is accomplished by NAND gate 58. The step represented by block 68 provides the SME detect signal in response to detection of the POR signal and the modified version of the test voltage being at a high logic level. Step 68 is accomplished by inverter 60, which outputs the SME detect signal on line 22 to the SMCL 20.

The method also includes the steps of providing the SMCL 20 which is enabled by activation of the SME detect signal, and providing the NMCL 24. Additionally, this method comprises the step of executing the SMCL 20 in response to detection of the SME detect signal, and preventing execution of the NMCL 24 while the SMCL 20 is executing. This method also includes the step of multiplexing different combinations of data into the SMCL 20 which, when enabled by activation of the SME detect signal, will correspond to different functions to be performed by the SMCL 20. If this later step of multiplexing is needed, it is accomplished by inputing data to the SMCL 20 from the I/O pins 12. In this method of operation, the microcontroller 10 is a free-running microcontroller as previously defined, and the test voltage is greater than $V_{DD}$. Lastly, note that the step represented by block 70 for executing the testing, is accomplished by a user inputing data and/or instructions to the device 10 via I/O pins 12, once the device has entered test mode as disclosed above. Block 72 represents the condition where the user is done with testing the device 10, and at that point, if required, it may then initiate normal device operations per the NMCL 24. Alternatively, if no further operations of the device 10 are required, the user simply terminates testing mode operation, and the device 10 does nothing more until prompted.

Referring now to FIG. 1, it should be pointed out that the general manner of making and using a microcontroller such as a free-running microcontroller 10 are well known to those skilled in the art, and therefore these concepts will not be fully discussed except as previously disclosed, and as discussed below. Note however, that the specific structure disclosed for the microcontroller 10, and in particular the SMEDL 18 is not well known, so it has been particularly described; however, there are a few more points of interest regarding the SMEDL 18. In particular, the SMEDL 18 represents an input path or circuit that is capable of detecting when a test or special mode is to be implemented for the device 10. In the case of a microcontroller having a dedicated test mode detection pin (not the case with the instant invention), the SMEDL 18 could be implemented simply by providing a plain wired input path or a simple input buffer to the SMCL 20. In the case here (where there is no dedicated test mode detection pin) the SMEDL 18 would be as shown in FIG. 3. In this circuit, the POR signal is the output of a PUDC 56, which is well known to those skilled in the art, that guarantees that $V_{DD}$ is at a sufficient level to run the device's circuitry. Typically, this POR level is set generally above the absolute minimum necessary for the device's circuitry to operate. In an alternative embodiment of the instant invention, the POR output of the PUDC 56 could be fed directly to points downstream of inverter 60 in the SMCL 20 where the SME detect signal is used. Here, the NAND gate 58 would be removed, and an odd number of the inverters 50, 52, and 60 would be used under the polarity used in FIG. 3; however, under different polarity, an even number of inverters could be used.

Again with reference to FIG. 1, the input logic blocks 14 are well known to those skilled in the art, so they are not shown or discussed down to component level. Each input logic block 14 is simply used to indicate any one of a number of input buffers well known to those skilled in the art. Similarly, the output logic blocks 16 are well known to those skilled in the art, so they are also not shown or discussed down to component level; however, the output logic blocks 16 each constitute any one of a number of output buffers well known to those skilled in the art that can drive high and/or low levels onto their respective I/O pins 12.

The SMCL 20 receives the SME detect signal to indicate that the device 10 is to be put into test mode, and possibly other inputs from the I/O pins 12 (if necessary) to indicate which one of several possible test modes to enter. The SMCL 20, when activated by the SME detect signal, sends signals over line or bus 26 to the NMCL 24 to inhibit normal device operation while in the test mode. The logic necessary to implement the SMCL 20 could be in any one of a number of manners well known to those skilled in the art. Similarly, the NMCL 24 could be implemented using any one of a number of different manners well known to those skilled in the art, and the NMCL 24 constitutes the logic necessary for normal (non-test mode) operation of the device 10. Oftentimes (especially during testing of the device 10), many of the NMCL's circuits are used by the SMCL 20 in test mode operation. Thus, the SMCL 20 can, in any one of a number of ways well known to those skilled in the art, prohibit normal execution of certain portions of the NMCL 24 unneeded by test mode operation. For device 10, the NMCL 24 represents the devices core and peripheral circuitry well known to those skilled in the art.

Lastly, note that in order to successfully implement device 10 onto a silicon substrate, it is necessary to ensure that the application of the test mode enabling voltage will not turn on any parasitic components that will create a connection to $V_{DD}$. This was accomplished through the exclusive use of isolated well devices (as opposed to standard type $V_{DD}$ tied well connections for the n-well process) within the SMEDL 18, and any other circuitry using the high voltage test mode enable signal. The use of isolated well devices such as this is well known to those skilled in the art, and therefore, will not be discussed in more detail.

Although the invention has been particularly shown and described with reference to a preferred embodiment thereof, it will be understood by those skilled in the art that changes in form and detail may be made therein without departing from the spirit and scope of the invention. For example, the instant invention includes (although not explicitly shown in the figures) an I/O pin 12 that can be, upon action by a user, configured as a reset pin. In the preferred embodiment of the instant invention, the device 10 and its method of operation are primarily directed to a free-running microcontroller; however, if this shared pin mentioned directly above were configured by a user to function as a reset pin, the device, as configured, would not be free-running, but rather normal operation could be interrupted by the test mode. In this case, the device 10 would still include SMEDL 18 operating as previously discussed, and the claimed methodology of first applying the test voltage followed by $V_{DD}$ could apply to the case of either a free-running or a non-free-running microcontroller device. Additionally, FIG. 1 shows each pin 12 as an I/O pin; however, those skilled in the art realize that the inventive structure and methodology here disclosed could be implemented, if desired, with any one or more of the pins 12 as being input only, output only, input/output (as shown), or some other combination of pin logic well known to those skilled in the art. Moreover, additional types of pins well known to those skilled in the art could be implemented to the device 10 of FIG. 1. In that case, those skilled in the art would recognize that such trivial changes would not significantly depart from the inventive structure and corresponding methodology here disclosed.

What is claimed is:

1. A device comprising, in combination:

a free-running microcontroller; and a plurality of Input/Output (I/O) pins for said free-running microcontroller wherein a shared pin of said plurality of I/O pins is provided with a NAND gate having a first input from said shared pin, and power up detect circuitry having an output coupled to a second input of said NAND gate.

2. The device of claim 1 wherein each I/O pin of said plurality of I/O pins is provided with input logic and with output logic.

3. The device of claim 1, further comprising:

a transistor having an input connected to said shared pin;

a first inverter connected to an output of said transistor; and a second inverter connected to said first inverter, and having an output connected to said first input of said NAND gate.

4. The device of claim 1, further comprising an inverter connected to an output of said NAND gate.

5. The device of claim 1, further including a first portion of control logic connected to an output of said NAND gate and having an output to a second portion of control logic.

6. The device of claim 5 wherein said second portion of control logic has an output enable line coupled to a portion of each I/O pin of said plurality of I/O pins.

7. The device of claim 5 wherein said first portion of control logic is coupled to a portion of each I/O pin of said plurality of I/O pins.

8. The device of claim 1 wherein said shared pin is provided with said special mode enable detect logic and with input logic only.

9. The device of claim 1 wherein said shared pin is provided with said special mode enable detect logic and with output logic only.

10. A device comprising, in combination:

a free-running microcontroller; and a plurality of Input/Output (I/O) pins for said free-running microcontroller wherein a shared pin of said plurality of I/O pins is provided with special mode enable detect logic;

wherein each I/O pin of said plurality of I/O pins is provided with input logic and with output logic;

wherein said special mode enable detect logic comprises:
a NAND gate having a first input from said shared pin;
power up detect circuitry having an output coupled to a second input of said NAND gate;
a transistor having an input connected to said shared pin;
a first inverter connected to an output of said transistor;
a second inverter connected to said first inverter, and having an output connected to said first input of said NAND gate; and
an inverter connected to an output of said NAND gate;

said device further including a first portion of control logic connected to an output of said special mode enable detect logic and having an output to a second portion of control logic;

wherein said second portion of control logic has an output enable line coupled to a portion of each I/O pin of said plurality of I/O pins; and wherein said first portion of control logic is coupled to a portion of each I/O pin of said plurality of I/O pins.

11. A method for placing a microcontroller device into a special operating mode comprising the steps of:

providing a microcontroller;

applying a test voltage to said microcontroller; and applying a supply voltage ($V_{DD}$) to said microcontroller, after said step of applying said test voltage.

12. The method of claim 11, further comprising the steps of:

providing a Power On Reset (POR) signal when $V_{DD}$ is at a level sufficient for running said microcontroller;

detecting when said POR signal and a modified version of said test voltage are both at a high logic level; and providing a Special Mode Enable (SME) detect signal in response to detection of said POR signal and said modified version of said test voltage being at said high logic level.

13. The method of claim 12 further comprising the steps of:

providing special mode control logic which is enabled by activation of said SME detect signal; and providing normal mode control logic.

14. The method of claim 13 wherein said special mode control logic is coupled to said normal mode control logic, and wherein said normal mode control logic is coupled to each Input/Output (I/O) pin of said microcontroller.

15. The method of claim 13 further comprising the step of executing said special mode control logic in response to detection of said SME detect signal.

16. The method of claim 15 further comprising the step of preventing execution of said normal mode control logic while said special mode control logic is executing.

17. The method of claim 13 further comprising the step of multiplexing different combinations of data into said special mode control logic which, when enabled by activation of said SME detect signal, will correspond to different functions to be performed by said special mode control logic.

18. The method of claim 11 wherein said microcontroller is a free-running microcontroller.

19. The method of claim 11 wherein said test voltage is greater than $V_{DD}$.

* * * * *